US009093268B2

(12) United States Patent
Zhou

(10) Patent No.: US 9,093,268 B2
(45) Date of Patent: Jul. 28, 2015

(54) SEMICONDUCTOR DEVICE INCLUDING POROUS LOW-K DIELECTRIC LAYER AND FABRICATION METHOD

(71) Applicant: Semiconductor Manufacturing International (Shanghai) Corporation, Shanghai (CN)

(72) Inventor: Ming Zhou, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/178,494

(22) Filed: Feb. 12, 2014

(65) Prior Publication Data

US 2014/0291817 A1    Oct. 2, 2014

(30) Foreign Application Priority Data

Apr. 2, 2013  (CN) .......................... 2013 1 0113287

(51) Int. Cl.
*H01L 21/3205* (2006.01)
*H01L 21/02* (2006.01)
*H01L 23/532* (2006.01)

(52) U.S. Cl.
CPC .... *H01L 21/02348* (2013.01); *H01L 21/02203* (2013.01); *H01L 21/02211* (2013.01); *H01L 21/02216* (2013.01); *H01L 21/02271* (2013.01); *H01L 23/5329* (2013.01)

(58) Field of Classification Search
CPC .................. H01L 21/02203; H01L 21/02118
USPC .......................................... 438/89; 148/33.3
See application file for complete search history.

(56) References Cited

U.S. PATENT DOCUMENTS

| 6,440,876 | B1 * | 8/2002 | Wang et al. | 438/778 |
| 6,846,515 | B2 * | 1/2005 | Vrtis et al. | 427/255.29 |
| 7,169,715 | B2 * | 1/2007 | Ott et al. | 438/780 |
| 7,968,471 | B2 * | 6/2011 | Harada et al. | 438/780 |
| 2004/0039219 | A1 * | 2/2004 | Chen et al. | 556/464 |
| 2005/0277756 | A1 * | 12/2005 | Iwabuchi et al. | 528/38 |
| 2006/0097359 | A1 * | 5/2006 | Goodner | 257/632 |
| 2010/0015816 | A1 * | 1/2010 | Chan et al. | 438/778 |
| 2010/0052114 | A1 * | 3/2010 | Hara et al. | 257/632 |
| 2011/0046314 | A1 * | 2/2011 | Klipp et al. | 525/389 |
| 2011/0076416 | A1 * | 3/2011 | Klipp et al. | 427/487 |
| 2011/0206857 | A1 * | 8/2011 | Yim et al. | 427/493 |
| 2013/0207245 | A1 * | 8/2013 | Inoue et al. | 257/632 |

* cited by examiner

*Primary Examiner* — George Fourson, III
(74) *Attorney, Agent, or Firm* — Anova Law Group, PLLC

(57) ABSTRACT

Semiconductor devices including porous low-k dielectric layers and fabrication methods are provided. A dielectric layer is formed on a substrate by introducing and polymerizing a main reaction gas on a surface of the substrate. The main reaction gas has a chemical structure including a ring-shaped group, silicon, carbon, and hydrogen, and the ring-shaped group includes at least carbon and hydrogen. A porous low-k dielectric layer is then formed from the dielectric layer by curing the dielectric layer with UV light.

17 Claims, 5 Drawing Sheets

SEMICONDUCTOR DEVICE INCLUDING POROUS LOW-K DIELECTRIC LAYER AND FABRICATION METHOD

CROSS-REFERENCES TO RELATED APPLICATIONS

This application claims priority to Chinese Patent Application No. CN201310113287.4, filed on Apr. 2, 2013, the entire contents of which are incorporated herein by reference.

FIELD OF THE DISCLOSURE

The present disclosure generally relates to the field of semiconductor manufacturing technology and, more particularly, relates to semiconductor devices including porous low-k dielectric layers and methods for forming the same.

BACKGROUND

In very large scale integration (VLSI) technology, thermal stable and moisture resistant silicon dioxide is widely used as an inter-layer dielectric material for metal interconnects. The metal interconnects are often made of aluminum. However, with shrunk device components and increased degree of integration, the number of interconnects has continually increased. Consequently, parasitic effects generated by the resistor (R) and capacitor (C) in the interconnect structure can cause serious RC delay.

Therefore, to lower resistance of conducting lines, copper has been widely used in the interconnect structure to replace aluminum as an interconnect material, due to a high melting point, a low resistivity, and a high resistance to electron migration. To lower the parasitic capacitance, materials with low dielectric constant (i.e., low-k) are used to reduce the parasitic capacitance.

FIG. 1 depicts an existing method for forming a porous low-k dielectric layer. As shown, a substrate 100 is provided and placed in a reaction chamber (not shown). Two main reaction gases, diethoxymethylsilane (DEMS) 101 and terpinene (ATRP) 102, are introduced into the reaction chamber. A temperature in the reaction chamber is about 300° C. After a period of time, a dielectric layer 103 can be formed on the surface of the substrate 100. Then, referring to FIGS. 3-4, the dielectric layer 103 is cured by UV light 104 to form a porous low-k dielectric layer 105.

However, existing methods for forming the porous low-k dielectric layer include complicated processes with low production efficiency.

BRIEF SUMMARY OF THE DISCLOSURE

One aspect of the present disclosure includes a method for forming a semiconductor device. A dielectric layer is formed on a substrate by introducing and polymerizing a main reaction gas on a surface of the substrate. The main reaction gas has a chemical structure including a ring-shaped group, silicon, carbon, and hydrogen, and the ring-shaped group includes at least carbon and hydrogen. A porous low-k dielectric layer is formed from the dielectric layer by curing the dielectric layer with UV light.

Another aspect of the present disclosure includes a semiconductor device. A porous low-k dielectric layer is disposed on a substrate by curing a dielectric layer on a surface of the substrate using UV light. The dielectric layer includes a main reaction gas polymerized on the surface of the substrate. The main reaction gas has a chemical structure including a ring-shaped group, silicon, carbon, and hydrogen, and the ring-shaped group includes at least carbon and hydrogen.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
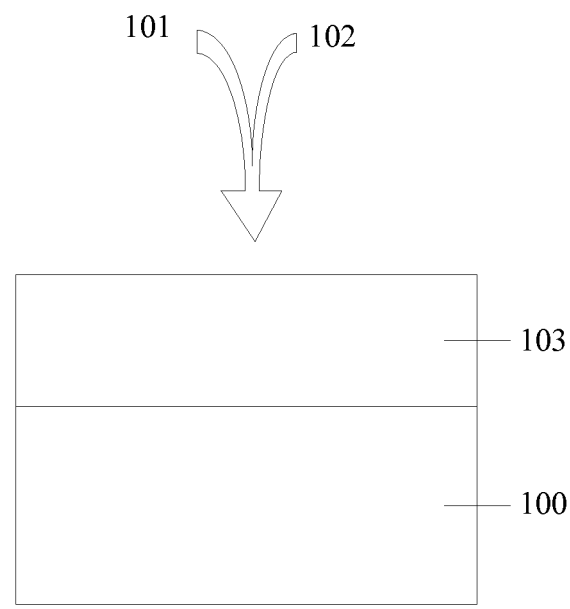
FIG. 1 depicts a cross-sectional view of a conventional dielectric layer.

Porous low-k dielectric layers are formed with complicated processes and low production efficiency. As shown in FIG. 1, a substrate 100 can be placed in a reaction chamber (not shown), and two main reaction gases, diethoxymethylsilane (DEMS) 101 and terpinene (ATRP) 102, can be introduced into the reaction chamber. The chemical structure of DEMS is

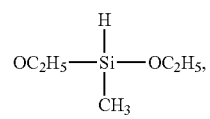

and the chemical structure of terpinene is

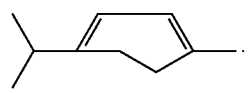

Figure 2:
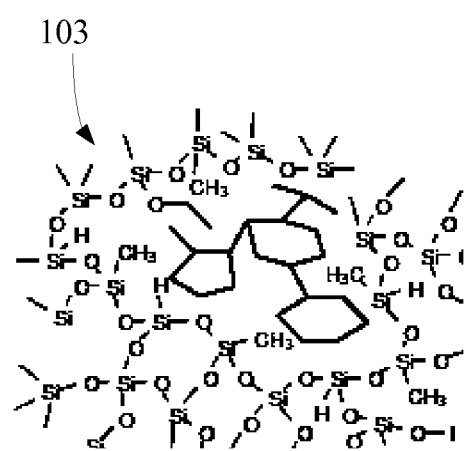
FIG. 2 is a schematic illustrating a molecular structure of a conventional dielectric layer.
Figure 5:
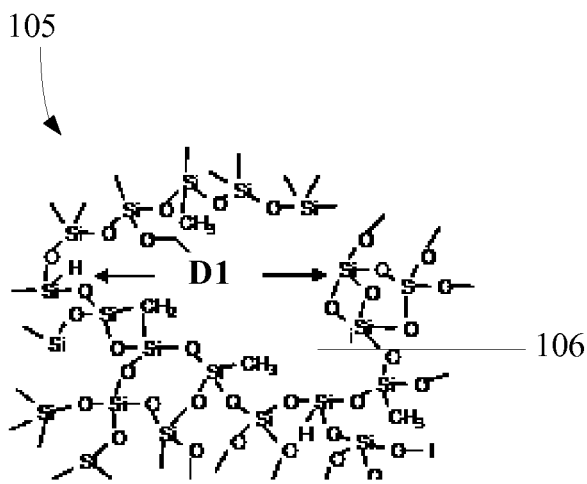
FIG. 5 is a schematic illustrating a molecular structure of a conventional porous low-k dielectric layer.

Referring to FIGS. 2 and 5, DEMS 101 can be a structure former precursor for forming the subsequently formed porous low-k dielectric layer 105, ATRP 102 can be a porogen precursor for forming a pore 106 in the subsequently formed porous low-k dielectric layer 105. Terpinene (ATRP) is used as a pore-forming agent.

Figure 3:
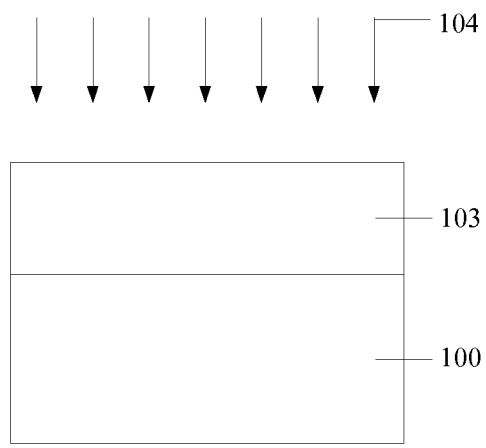
FIGS. 3-4 are schematics illustrating cross-sectional views of a conventional porous low-k dielectric layer.
Figure 4:
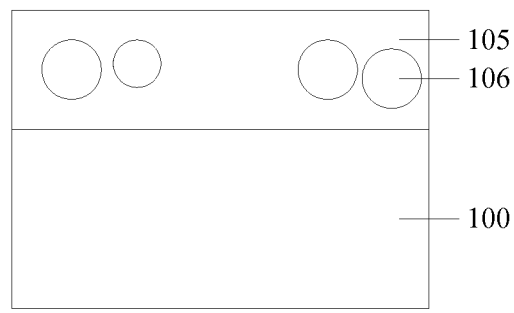

Referring to FIGS. 3-4, during the process when two main reaction gases are introduced into the reaction chamber, diethoxymethylsilane (DEMS) 101 and terpinene (ATRP) 102 can undertake polymerization on the substrate surface of the substrate 100 to form a non-porous dielectric layer 103, where diethoxymethylsilane (DEMS) is polymerized to form the skeleton structure of the dielectric layer, terpinene (ATRP) is polymerized to form a polymer that can then be decomposed and vaporized upon subsequent UV irradiation. The decomposition and vaporization of the polymer formed by terpinene (ATRP) polymerization can generate pores 106 within the dielectric layer. Therefore, after curing the dielectric layer 103 with UV light 104 the non-porous dielectric layer 103 can be converted to a porous low-k dielectric layer 105.

Referring back to FIGS. 2 and 5, the locations where the terpinene (ATRP) polymer has once resided previously can form pores 106 in the porous low-k dielectric layer 105. In existing methods, in the process of introducing the above mentioned two main reaction gases into the reaction chamber to form the porous low-k dielectric layer 105, the ratio of these two reaction gases must be maintained. If the percentage of the DEMS 101 in the main reaction gases is too high, the percentage of the ATRP 102 can be relatively low, then the number of the pores 106 in the subsequently formed porous low-k dielectric layer can be undesirably less and the porous low-k dielectric layer may still have a relatively large dielectric constant, which in turn may cause serious RC delay. If the percentage of the DEMS 101 in the main reaction gases is too low, the percentage of the ATRP 102 can be relatively high. Although the subsequently formed porous low-k dielectric layer may have a relatively small dielectric constant, the porous low-k dielectric layer may have large number of pores, resulting in undesirable mechanical strength for the subsequently formed porous low-k dielectric layer.

To form a porous low-k dielectric layer having both the mechanical strength and dielectric constant meet the desired requirements, the ratio of the two main reaction gases must be determined before the reaction occurs. In addition, the ratio of the two main reaction gases must be strictly controlled and in-situ monitored during the process. Therefore, existing methods for forming porous low-k dielectric layer can have complicated processes and low production efficiency.

Referring to FIGS. 4-5, existing methods for forming the pores 106 in the porous low-k dielectric layer 105 may have an average diameter that is overly large and have non-uniform distribution, thereby reducing the mechanical strength of the porous low-k dielectric layer. Such overly large average diameter of the pores 106 and the non-uniform distribution of the pores 106 in the porous low-k dielectric layer 105 can be generated due to the following reasons.

When the two main reaction gases DEMS 101 and ATRP 102 are introduced into the reaction chamber, terpinene (ATRP) molecules can crosslink with diethoxymethylsilane (DEMS) molecules and also can crosslink among themselves. Thus, a diethoxymethylsilane (DEMS) molecule can simultaneously crosslink with multiple terpinene (ATRP) molecules. Some terpinene (ATRP) molecules can crosslink with diethoxymethylsilane (DEMS) molecules and be grafted directly on the diethoxymethylsilane molecules (DEMS) and some can be grafted on those terpinene (ATRP) molecules that are already grafted on the diethoxymethylsilane (DEMS) molecules. Therefore, referring to FIGS. 2 and 5, the terpinene (ATRP) polymer thus formed can have more numbers of terpinene (ATRP) molecules, and the terpinene (ATRP) polymer thus formed can have large molecule weight and area. This can result in the pores 106 in the subsequently formed porous low-k dielectric layer 105 with overly large average diameter D1 (e.g., at least larger than 15 Å). Further, when the two main reaction gases DEMS 101 and ATRP 102 are introduced into the reaction chamber, in addition to the crosslinking between terpinene and diethoxymethylsilane molecules and crosslinking among terpinene molecules themselves, diethoxymethylsilane molecules can also crosslink with themselves to form the skeleton structure of the porous low-k dielectric layer 105. When terpinene molecules react with diethoxymethylsilane molecules, the polymerization of terpinene and diethoxymethylsilane molecules can be random. Specifically, when terpinene molecules crosslink with individual diethoxymethylsilane molecule, the subsequently formed porous low-k dielectric layer may have small pore diameter. When terpinene molecules crosslink with diethoxymethylsilane polymers, the subsequently formed porous low-k dielectric layer may have large pore diameter. Therefore, the subsequently formed porous low-k dielectric layer may have varying pore diameter and non-uniform pore distribution in the porous low-k dielectric layer. Both the large average pore diameter and the non-uniform pore distribution in the porous low-k dielectric layer may weaken the mechanical strength of the porous low-k dielectric layer.

Accordingly, a method for forming a porous low-k dielectric layer is disclosed herein, e.g., as shown in FIGS. 6-11.

Figure 6:
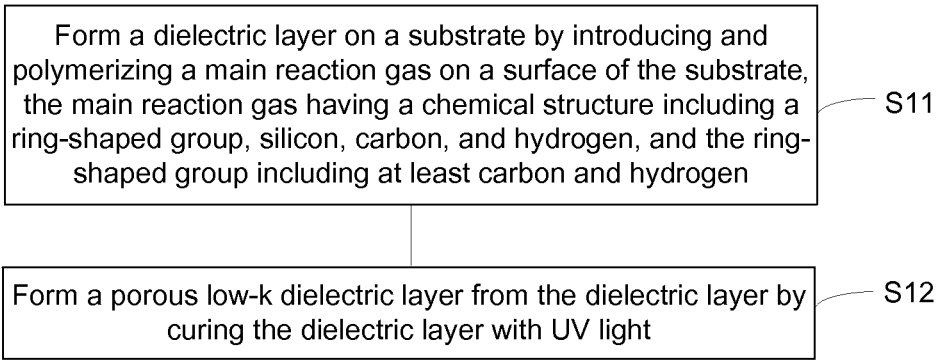
FIG. 6 is a schematic illustrating an exemplary method for forming an exemplary semiconductor device including a porous low-k dielectric layer in accordance with various disclosed embodiments.
Figure 7:
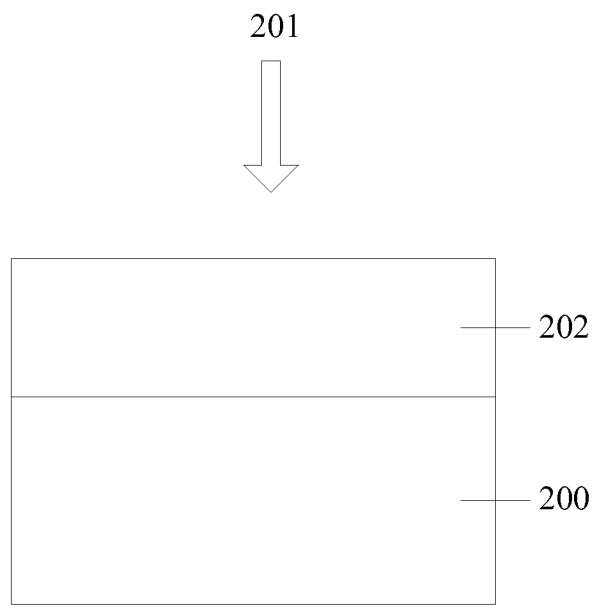
FIG. 7 is a schematic of a cross-sectional view of an exemplary semiconductor device including a dielectric layer in accordance with various disclosed embodiments.
Figure 8:
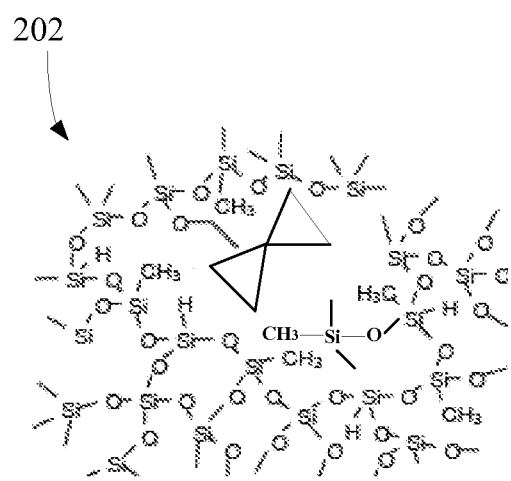
FIG. 8 is a schematic illustrating a molecular structure of a portion of an exemplary dielectric layer formed using (1-ethoxycyclopropoxy)trimethylsilane gas in accordance with various disclosed embodiments.
Figure 9:
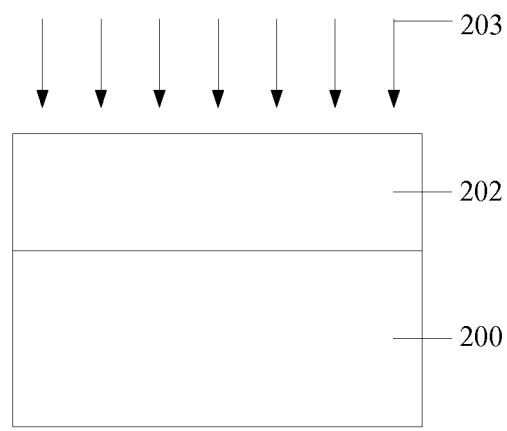
FIGS. 9-10 depict cross-sectional views of an exemplary porous low-k dielectric layer during formation in accordance with various disclosed embodiments.
Figure 10:
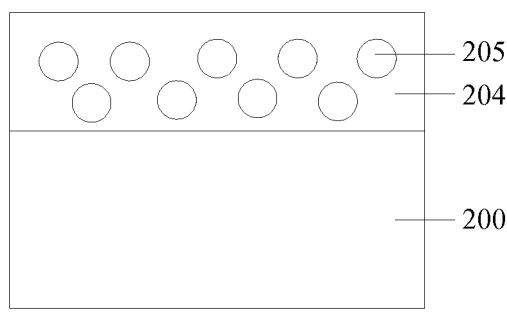
Figure 11:
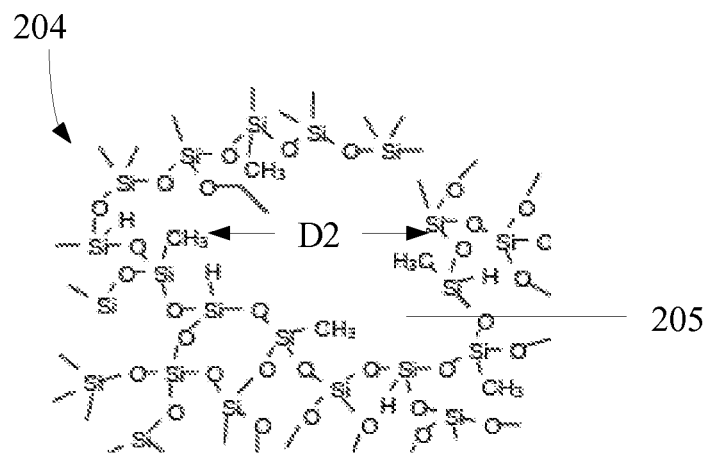
FIG. 11 is a schematic illustrating molecular structure of a portion of an exemplary porous low-k dielectric layer formed using (1-ethoxycyclopropoxy)-trimethylsilane gas in accordance with various disclosed embodiments.

FIG. 6 is a schematic flow diagram illustrating an exemplary method for forming a porous low-k dielectric layer; FIG. 7 is a schematic of a cross-sectional view of an exemplary dielectric layer in; FIG. 8 is a schematic illustrating molecular structure of a portion of an exemplary dielectric layer formed using (1-ethoxycyclopropoxy)trimethylsilane gas; FIGS. 9-10 are schematics of cross-sectional views of an exemplary porous low-k dielectric layer; and FIG. 11 is a schematic illustrating molecular structure of a portion of an exemplary porous low-k dielectric layer formed using (1-ethoxycyclopropoxy)trimethylsilane gas in accordance with various disclosed embodiments. Although the method of FIG. 6 are described related to the structures of FIGS. 7-11, the disclosed method and structures are not limited in any manner.

In Step S11 of FIG. 6 and referring to FIGS. 7-8, a substrate 200 is provided. A dielectric layer 202 is formed on the substrate 200. The reaction gas for forming the dielectric layer 202 can include a main reaction gas 201. The chemical structure of the main reaction gas 201 can include, e.g., a ring-shaped group, silicon, carbon, and hydrogen. The ring-shaped group can include, e.g., carbon and hydrogen.

In one embodiment, the substrate 200 can include: a substrate base layer (not shown) having semiconductor devices including, e.g., transistors or other devices therein; an interconnect structure including a metal interconnect (not shown) and disposed on the substrate base layer; and a barrier layer (not shown) disposed over the metal interconnect. The metal interconnect can electrically connect the semiconductor device(s) within the substrate base layer with the subsequently-formed other semiconductor devices. The barrier layer herein can be used to prevent metal diffusion from the metal interconnect. In other embodiments, the substrate 200 can simply be the substrate base layer having semiconductor devices such as, e.g., transistors.

The metal interconnect can be made of a material including, e.g., copper and/or aluminum. The barrier layer can be made of a material including, e.g., nitrogen doped silicon carbon (NDC). In various embodiments, NDC can better prevent metal diffusion from the metal interconnect. However, any suitable materials can be used for the metal interconnect and for the barrier layer without limitation.

Referring to FIG. 7, the substrate 200 can be placed in a reaction chamber (not shown), and the main reaction gas 201 can be introduced into the reaction chamber. The main reaction gas can have a chemical structure containing, e.g., a ring-shaped group, silicon, carbon and hydrogen. The ring-shaped group can include, e.g., carbon and hydrogen.

The main reaction gas 201 can include a structure former precursor that can subsequently form the skeleton structure of the porous low-k dielectric layer, and a porogen precursor that can subsequently form pores in the porous low-k dielectric layer. The silicon and carbon atoms in the chemical structure of the main reaction gas 201 must be integral parts of the skeleton structure of the subsequently formed porous low-k dielectric layer.

The ring-shaped group in the chemical structure of the main reaction gas 201 can be used (e.g., serve as predecessor) for forming pores in the subsequently formed porous low-k dielectric layer. For example, referring to FIGS. 7-8, after the main reaction gas 201 is introduced into the reaction chamber, a dielectric layer 202 can be formed on the substrate 200 and the crosslinked ring-shaped groups can have a 3-D structure. When the dielectric layer 202 is subsequently irradiated with UV light, the crosslinked ring-shaped groups can be decomposed and vaporized so that pores can be formed at the locations where the crosslinked ring-shaped groups have once resided in the dielectric layer.

The ring-shaped group in the main reaction gas 201 can include carbon and hydrogen, and can have at least three exemplary scenarios: (1) the ring-shaped group in the main reaction gas 201 can be a naphthenic (or cycloalkyl), including only carbon and hydrogen, e.g., cyclopropyl, cyclobutyl, cyclononyl, and/or cyclopentyl; (2) The ring-shaped group in the main reaction gas 201 can include, in addition to having the necessary carbon and hydrogen, carbon-carbon double bond or carbon-carbon triple bond, including, e.g., cyclopentenyl, and/or cyclopentadienyl; and/or (3) the ring-shaped group in the main reaction gas 201 can include epoxyalkyl, in addition to having the necessary carbon and hydrogen. For example, the ring-shaped group including epoxyalkyl can have oxygen in addition to the carbon and hydrogen. The ring-shaped group can include carbon-oxygen bond including, e.g., epoxypropyl, and/or epoxybutyl.

When the main reaction gas 201 is introduced to the reaction chamber, an auxiliary reaction gas can also be introduced to the reaction chamber. The auxiliary reaction gas can include helium, or helium and oxygen. The helium can serve as a carrier gas to transport the main reaction gas. When the structure former precursor of the main reaction gas 201 does not contain oxygen, the auxiliary reaction gas may include helium without oxygen. The auxiliary reaction gas may include helium and oxygen, and the oxygen can involve in the reaction of the main reaction gas to form the dielectric layer 202. When the structure former precursor of the main reaction gas 201 has oxygen, the oxygen in the auxiliary reaction gas can increase the number of oxygen atoms in the subsequently formed dielectric layer 202, which in turn improves the mechanical strength of the subsequently formed dielectric layer 202. Of course, when the structure former precursor of the main reaction gas 201 has oxygen, the auxiliary gas in various embodiments may not necessarily contain oxygen. However, the mechanical strength of the dielectric layer thus formed may not be as strong as the dielectric layer formed using oxygen in the auxiliary reaction gas as previously described.

In some embodiments where no auxiliary reaction gas is introduced into the reaction chamber during the process of introducing the main reaction gas, the disclosed methods can still be carried out to form a porous low-k dielectric layer having a mechanical strength lower than that formed with the auxiliary reaction gas.

In the cases when the auxiliary reaction gas includes helium and oxygen, an exemplary process for forming the dielectric layer 202 on the substrate 200 can include: a flow rate of the main reaction gas 201 ranging from about 0.05 g/min to about 10 g/min; a flow rate of helium ranging from about 100 sccm to about 5000 sccm; a flow rate of oxygen ranging from about 50 sccm to about 1000 sccm; a temperature in the reaction chamber ranging from about 100° C. to about 400° C.; and/or a pressure in the reaction chamber ranging from about 0.1 Torr to about 10 Torr.

In one embodiment, in addition to having oxygen atom on the ring-shaped group of the main reaction gas 201, the structure former precursor may also include oxygen atom(s). For example, in one embodiment, the main reaction gas 201 can be (1-ethoxycyclopropoxy)trimethylsilane, which has a chemical structure of:

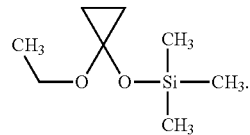

When (1-ethoxycyclopropoxy)trimethylsilane gas is introduced into the reaction chamber, part of the structure of the subsequently formed dielectric layer 202 is shown in FIG. 8. The 1-ethoxy-1-(trimethylsilyl) group in the (1-ethoxycyclopropoxy)trimethylsilane can be used as the structure former precursor, and the 1-ethoxy-1-(trimethylsilyl) group can crosslink with each other to form the skeleton structure of the dielectric layer 202. The cyclopropyl group in the (1-ethoxycyclopropoxy)trimethylsilane gas can be used as the porogen precursor to form pores, and the cyclopropane can be the predecessor of the pores in the subsequently formed porous low-k dielectric layer.

In one embodiment, referring to FIG. 8, the cyclopropyl groups of two (1-ethoxycyclopropoxy)trimethylsilane molecules can crosslink with each other to form a cyclic polymer, and the cyclic polymer can be decomposed and vaporized after subsequent UV irradiation. Referring to FIG. 11, a pore 205 can be formed at the location where the cyclic polymer has once resided in the dielectric layer 202. After the pore 205 is formed within the dielectric layer 202, the dielectric layer 202 can become porous low-k dielectric layer 204. The pore diameter D2 of the pore 205 in the porous low-k dielectric layer 204 can be less than or equal to about 9 Å, e.g., ranging from about 1 Å to about 9 Å.

A dielectric layer 202 can be formed on the substrate 200 by introducing a main reaction gas (1-ethoxycyclopropoxy)trimethylsilane, along with the auxiliary reaction gas of helium and oxygen, into the reaction chamber. An exemplary process for forming the dielectric layer 202 can include: a flow rate of (1-ethoxycyclopropoxy)trimethylsilane gas ranging from about 0.05 g/min to about 10 g/min; a flow rate of helium ranging from about 100 sccm to about 5000 sccm; a flow rate of oxygen ranging from about 50 sccm to about 1000 sccm; a temperature in the reaction chamber ranging from about 100° C. to about 400° C.; and/or a pressure in the reaction chamber ranging from about 0.1 Torr to about 10 Torr.

In certain other embodiments, the main reaction gas may not include oxygen in its own chemical structure. For example, the main reaction gas can be cyclopropyl (trimethylsilyl) acetylene, which has a chemical structure of:

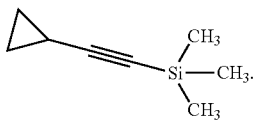

When cyclopropyl (trimethylsilyl) acetylene gas is introduced into the reaction chamber, the (trimethylsilyl) ethynyl groups of the cyclopropyl (trimethylsilyl) acetylene can crosslink with each other to form the skeleton structure of the dielectric layer. The cyclopropyl group of the cyclopropyl-(trimethylsilyl) acetylene can be the predecessor of the subsequently formed pore(s) in the porous low-k dielectric layer. In one embodiment, the cyclopropyl groups of two cyclopropyl-(trimethylsilyl) acetylene molecules can crosslink with each other to form a cyclic polymer, and the cyclic polymer can be decomposed and vaporized after subsequent UV irradiation. Pores can be formed at the locations where the cyclic polymers have once resided in the dielectric layer. After pores are formed within the dielectric layer, the dielectric layer can become porous low-k dielectric layer.

A dielectric layer can be formed on the substrate by introducing main reaction gas cyclopropyl-(trimethylsilyl) acetylene, along with the auxiliary reaction gas of helium and oxygen, into the reaction chamber. An exemplary process for forming the dielectric layer can include: a flow rate of cyclopropyl-(trimethylsilyl) acetylene gas ranging from about 0.05 g/min to about 10 g/min; a flow rate of helium ranging from about 100 sccm to about 5000 sccm; a flow rate of oxygen ranging from about 50 sccm to about 1000 sccm; a temperature in the reaction chamber ranging from about 100° C. to about 400° C.; and/or a pressure in the reaction chamber ranging from about 0.1 Torr to about 10 Torr.

In one embodiment, the chemical structure of the main reaction gas 201 can include a structure former precursor that can subsequently form the structure of the porous low-k dielectric layer, and a porogen precursor that can subsequently form pores of the porous low-k dielectric layer. The silicon and carbon in the chemical structure of the main reaction gas 201 can be the integral parts (or must-have parts) of the skeleton structure of the subsequently formed porous low-k dielectric layer. The ring-shaped group in the chemical structure of the main reaction gas 201 can serve as predecessor for forming the pores in the subsequently formed porous low-k dielectric layer.

Unlike conventional methods, there is no need to adjust the ratio between different main reaction gases during the formation of the dielectric layer, and there is no need to in-situ monitor the ratio between different main reaction gases. The disclosed methods can reduce processing steps, lower the processing complexity, and improve processing efficiency for forming the dielectric layer 202. In addition, there is no need to use additional equipment for the main reaction gases as required by conventional methods, only one type of equipment for the main reaction gas is required during the formation of the dielectric layer 202 as disclosed. Processing cost can thus be reduced.

In step S12 of FIG. 6 and referring to FIGS. 9-11, UV light 203 can be used to cure the dielectric layer 202, thereby forming porous low-k dielectric layer 204.

For example, referring to FIG. 9, UV light 203 can be used to irradiate the dielectric layer 202. The UV light 203 can have a wavelength ranging from about 10 nm to about 400 nm, an irradiation power ranging from about 50 W to about 100 W, and an irradiation time ranging from about 63 seconds to about 77 seconds. The heat generated by the UV light 203 can decompose and vaporize polymer made by the ring-shaped group (referring to FIGS. 8-9), thereby forming pores 205 at the locations where the polymer(s) made by the ring-shaped group have once resided in the dielectric layer 202 (referring to FIGS. 10-11). Meanwhile, the dielectric constant of the dielectric layer 202 can be decreased so that the dielectric layer 202 can be converted to porous low-k dielectric layer 204.

Referring to FIG. 8, in one embodiment, when the main reaction gas has a molecular formula of (1-ethoxycyclopropoxy)trimethylsilane, the cyclopropyl groups of two (1-ethoxycyclopropoxy)trimethylsilane molecules can crosslink with each other to form a cyclic polymer. Referring to FIG. 9, the cyclic polymer can be decomposed and vaporized after subsequent UV light irradiation. Referring to FIGS. 9-10, pores 205 can be formed at the locations where the cyclic polymers have once resided in the dielectric layer 202. At this time, the dielectric layer 202 can become porous low-k dielectric layer 204.

In one embodiment, the disclosed methods further include selecting the main reaction gas such that a polymerization is controlled to be occurred between molecules of the main reaction gas. In addition, the polymerization of the main reaction gas can be controlled to have desired pore size and distribution. For example, the main reaction gas can have a chemical structure having a silicon atom and a ring-shaped group. When the main reaction gas is introduced into the reaction chamber, polymerization can occur between molecules of the main reaction gas. The polymerization between silicon atom and the ring-shaped group of the main reaction gas does not include a polymerization between the structure former precursors and a polymerization between porogen precursors used in existing methods. Therefore, the polymerization between molecules of the main reaction gas can be a regular polymerization reaction (having a certain pattern).

For example, the polymerization between molecules of the main reaction gas (e.g., having a silicon-containing main chain with a ring-shaped group) can essentially between the silicon-containing main chain(s) and the ring-shaped group (s), which does not include polymerization between silicon-containing main chains nor include polymerization between ring-shaped groups. Consequently, the subsequently formed porous low-k dielectric layer can have pores with substantially same pore diameter with substantially uniform pore distribution. The porous low-k dielectric layer with uniformly distributed pores can have a higher mechanical strength than the porous low-k dielectric layer with non-uniform pore distribution.

The average pore diameter of the pores in the subsequently formed porous low-k dielectric layer can directly affect the mechanical strength of the subsequently formed porous low-k dielectric layer. The smaller the pore diameter, the stronger the mechanical strength of the subsequently formed porous low-k dielectric layer. In one embodiment, to form pores with small average pore diameter, the ring-shaped group may not have too many carbon atoms (or too high molecule weight).

When the ring-shaped group is a cycloalkyl group, the number of carbon atoms in the cycloalkyl group can range from about 3 to about 10, i.e., the cycloalkyl group can range from cyclopropane to cyclooctane. If the number of the carbon atoms in the cycloalkyl group is greater than 10, the average pore diameter of the pores in the subsequently formed porous low-k dielectric layer can be relatively large. For example, in one embodiment, the average pore diameter D2 of the porous low-k dielectric layer 204 can be greater than 9 Å, thereby affecting the mechanical strength of the porous low-k dielectric layer.

The total number of carbon atoms in the cycloalkyl group can be at least about 3, otherwise, there will be no cycloalkyl group, and no pores can be formed, thereby no porous low-k dielectric layer 204 can be formed. When the ring-shaped group includes an epoxy group, the total number of carbon and oxygen atoms in the epoxy group can range from about 3 to about 10. If the total number of carbon and oxygen atoms in the epoxy group is greater than 10, the average pore diameter of the pores 205 in the subsequently formed porous low-k dielectric layer 204 can be relatively large. For example, in one embodiment, the average pore diameter of the porous low-k dielectric layer can be larger than 9 Å. The total number of carbon atoms in the epoxy group can be at least about 3, otherwise, no porous low-k dielectric layer can be formed. In one embodiment, the cycloalkyl group can be cyclopropane or propylene oxide. Since cyclopropane or propylene oxide can have minimal number of atoms in their cyclic structure, the subsequently formed cyclic polymer can have minimal molecular weight, the subsequently formed pores in the dielectric layer can have a minimal average pore diameter, and therefore the subsequently formed porous low-k dielectric layer can have a high mechanical strength.

In one embodiment, the main reaction gas 201 that is introduced into the reaction chamber can have only one type of gas. In other embodiments, the main reaction gas 201 can have two or more types of gases. However, the chemical structures of these two or more types of reaction gases can include a ring-shaped group, silicon, carbon, and hydrogen. The ring-shaped group can include at least carbon and hydrogen. For example, in one embodiment, (1-ethoxycyclopropoxy)trimethylsilane gas and cyclopropyl (trimethylsilyl) acetylene gas can be simultaneously introduced into the reaction chamber.

When the main reaction gas 201 includes two or more types of gases, an auxiliary reaction gas can also be introduced into the reaction chamber. The auxiliary reaction gas can include helium, or helium and oxygen. When the auxiliary reaction gas includes oxygen and helium, exemplary process parameters can include: an overall flow rate of (1-ethoxycyclopropoxy)trimethylsilane gas and cyclopropyl (trimethylsilyl) acetylene gas ranging from about 0.05 g/min to about 10 g/min; a flow rate of helium ranging from about 100 sccm to about 5000 sccm; a flow rate of oxygen ranging from about 50 sccm to about 1000 sccm; a temperature in the reaction chamber ranging from about 100° C. to about 400° C.; and/or a pressure in the reaction chamber ranging from about 0.1 Torr to about 10 Torr.

When the main reaction gas 201 includes two or more types of gases, each reaction gas can have a chemical structure including a structure former precursor that can subsequently form the structure of the porous low-k dielectric layer; and the porogen precursor that can subsequently form the pores. Similarly, the disclosed method can thus reduce processing steps, lower processing complexity, and improve processing efficiency for forming the dielectric layer 202.

It should be noted that when the main reaction gas includes two or more types of gases, the pore distribution in the subsequently formed porous low-k dielectric layer may not be as uniform as when the main reaction gas includes only one type of gas.

The disclosed methods can provide a porous low-k dielectric layer. The porous low-k dielectric layer can be formed in accordance with various disclosed embodiments as described above. The porous low-k dielectric layer can have an average pore diameter of about 9 Å or less.

Other applications, advantages, alternations, modifications, or equivalents to the disclosed embodiments are obvious to those skilled in the art.

What is claimed is:

1. A method for forming a semiconductor device comprising:
   providing a substrate;
   forming a dielectric layer on the substrate by introducing and polymerizing a main reaction gas on a surface of the substrate, wherein the main reaction gas has a chemical structure including a ring-shaped group, silicon, carbon, and hydrogen, and wherein the ring-shaped group includes at least carbon and hydrogen, including a cycloalkyl group; and
   forming a porous low-k dielectric layer from the dielectric layer by curing the dielectric layer with UV light, wherein a number of carbon atoms of the cycloalkyl group is controlled, such that the porous low-k dielectric layer is formed to have an average pore diameter of about 9 Å or less.

2. The method of claim 1, wherein the chemical structure of the main reaction gas further includes oxygen.

3. The method of claim 1, wherein the ring-shaped group includes a carbon-carbon double bond, a carbon-carbon triple bond, or a combination thereof.

4. The method of claim 1, wherein the ring-shaped group includes a carbon-oxygen bond.

5. The method of claim 4, further including:
   controlling a total number of atoms of the carbon and the oxygen in the ring-shaped group such that the porous low-k dielectric layer is formed to have an average pore diameter of about 9 Å or less, wherein the total number of atoms of the carbon and the oxygen in the ring-shaped group ranges from about 3 to about 10.

6. The method of claim 1, wherein the number of carbon atoms of the cycloalkyl group ranges from about 3 to about 10.

7. The method of claim 1, wherein the main reaction gas includes cyclopropyl(trimethylsilyl)acetylene, (1-ethoxycyclopropoxy)trimethylsilane, or a combination thereof.

8. The method of claim 1, wherein the main reaction gas for forming the dielectric layer further includes an auxiliary reaction gas, the auxiliary gas including helium.

9. The method of claim 8, wherein the auxiliary reaction gas further includes oxygen.

10. The method of claim 1, wherein forming the dielectric layer on the substrate includes: forming the dielectric layer in a reaction chamber having a flow rate of the main reaction gas ranging from about 0.05 g/min to about 10 g/min; a flow rate of helium ranging from about 100 sccm to about 5000 sccm; a flow rate of oxygen ranging from about 50 sccm to about 1000 sccm; a temperature in the reaction chamber ranging from about 100° C. to about 400° C.; and a pressure in the reaction chamber ranging from about 0.1 Torr to about 10 Torr.

11. The method of claim 1, wherein curing the dielectric layer with the UV light utilizes a wavelength of the UV light ranging from about 10 nm to about 400 nm, an irradiation power of the UV light ranging from about 50 W to about 100 W, and an irradiation time ranging from about 63 seconds to about 77 seconds.

12. The method of claim 1, wherein curing the dielectric layer with the UV light forms the porous low-k dielectric layer including a plurality of pores distributed in a skeleton structure of the dielectric layer, wherein the skeleton structure contains at least silicon.

13. The method of claim 1, further including:
selecting the main reaction gas such that a polymerization is controlled to be occurred between molecules of the main reaction gas,
wherein the main reaction gas contains a silicon-containing main chain with the ring-shaped group, and
wherein the polymerization is controlled essentially between the silicon-containing main chain and the ring-shaped group and the polymerization does not include a polymerization between silicon-containing main chains and does not include a polymerization between ring-shaped groups.

14. A semiconductor device comprising:
a substrate; and
a porous low-k dielectric layer disposed on the substrate by curing a dielectric layer on a surface of the substrate using UV light,
wherein the dielectric layer includes a main reaction gas polymerized on the surface of the substrate,
wherein the main reaction gas has a chemical structure including a ring-shaped group, silicon, carbon, and hydrogen, and the ring-shaped group includes at least carbon and hydrogen, and
wherein the porous low-k dielectric layer has an average pore diameter of about 9 Å or less.

15. The device of claim 14, wherein the porous low-k dielectric layer includes a plurality of pores distributed in a skeleton structure of the dielectric layer, wherein the skeleton structure contains at least silicon.

16. The device of claim 14, wherein the main reaction gas includes cyclopropyl(trimethylsilyl)acetylene and (1-ethoxycyclopropoxy)trimethylsilane.

17. The device of claim 14, wherein the ring-shaped group includes a carbon-carbon double bond, a carbon-carbon triple bond, a carbon-oxygen bond, a cycloalkyl group, or a combination thereof.

* * * * *